(12) United States Patent
Zeighami et al.

(10) Patent No.: US 7,305,518 B2
(45) Date of Patent: Dec. 4, 2007

(54) METHOD AND SYSTEM FOR DYNAMICALLY ADJUSTING DRAM REFRESH RATE

(75) Inventors: Roy Mehdi Zeighami, McKinney, TX (US); Brian M. Johnson, Allen, TX (US); John M. Wastlick, Allen, TX (US); David Russel Soper, Murphy, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 413 days.

(21) Appl. No.: 10/969,662

(22) Filed: Oct. 20, 2004

(65) Prior Publication Data

US 2006/0085616 A1    Apr. 20, 2006

(51) Int. Cl.
*G06F 12/00* (2006.01)

(52) U.S. Cl. ........................ 711/106; 711/105

(58) Field of Classification Search ............... None
See application file for complete search history.

(56) References Cited

U.S. PATENT DOCUMENTS

| | | | |
|---|---|---|---|
| 5,276,843 A * | 1/1994 | Tillinghast et al. | 711/105 |
| 5,278,796 A | 1/1994 | Tillinghast et al. | |
| 5,446,696 A | 8/1995 | Ware et al. | |
| 5,784,328 A | 7/1998 | Irrinki et al. | |
| 6,483,764 B2 | 11/2002 | Chen Hsu et al. | |
| 6,557,072 B2 * | 4/2003 | Osborn | 711/106 |
| 6,768,693 B2 * | 7/2004 | Feurle et al. | 365/222 |

* cited by examiner

*Primary Examiner*—T Nguyen

(57) ABSTRACT

One embodiment is a method of dynamically adjusting a rate at which a dynamic random access memory ("DRAM") module is refreshed in a computer system. The method comprises monitoring a plurality of system conditions; detecting a change in at least one of the monitored system conditions; responsive to the detection, determining an optimum refresh rate for a current state of the computer system; and setting the refresh rate to the determined optimum refresh rate.

31 Claims, 2 Drawing Sheets

Manageability Firmware Loop

System Firmware Loop

METHOD AND SYSTEM FOR DYNAMICALLY ADJUSTING DRAM REFRESH RATE

BACKGROUND

It is common knowledge that Dynamic Random Access Memory ("DRAM") modules are comprised of capacitive electrical cells that leak their charge out over time. As a result, DRAM cells must be recharged, or "refreshed", thousands of times per second or they lose their data. Reading from or writing to a DRAM cell refreshes its charge, so a common way of refreshing a DRAM is to read periodically from each cell. This is typically accomplished by only activating each row using Row Address Strobe or RAS. In addition, a DRAM cell controller takes care of scheduling the refresh cycles and making sure that they don't interfere with regular reads and writes. So to keep the data in DRAM module from leaking away, the cell controller periodically sweeps through all of the rows by cycling RAS repeatedly and placing a series of row addresses on the address bus.

Even though the cell controller handles all the refreshes and tries to schedule them for maximum performance, having to go through and refresh each row every few milliseconds can interfere with the performance of reads and writes and thus have a serious negative impact on the performance of the DRAM modules. Clearly, it is beneficial to overall system performance to reduce the amount of time spent refreshing DRAM cells.

The number of refresh cycles required to refresh an entire DRAM module depends on the number of rows of DRAM cells in that module; the more rows, the greater the number of cycles required to refresh the entire module. Therefore, one manner in which to reduce the amount of time spent refreshing DRAM modules is to reduce the number of rows in the module.

Another manner in which to reduce the amount of time spent refreshing DRAM modules is to adjust the refresh rate; that is, the frequency with which the modules are refreshed. Commonly, there is a feature in the Basic I/O System ("BIOS") of a computer system that allows a user to set the refresh rate of the DRAM modules. In one embodiment, BIOS supports three different refresh rate settings, as well as an "AUTO" option. If the AUTO option is selected, the BIOS queries the DRAM modules and uses the lowest setting found for maximum compatibility. Optimizing the refresh rate is important, yet difficult. Refreshing too often negatively impacts system performance, as indicated above; however, refreshing too infrequently can result in lost data.

It will be recognized that various conditions can affect the optimization of the refresh rate. These conditions include temperature, power consumption, altitude, air pressure, DRAM manufacturer, memory module loading locations, and bus utilization, to name a few. For simplicity, all such conditions will hereinafter be collectively referred to as "system conditions". As previously noted, the refresh rate is set during boot-up of a computer system and remains at that rate until the system is rebooted. In other words, currently, the refresh rate is not adaptable to changes in one or more of the above-noted system conditions during use of the system. For example, a change in temperature may result in a need for a change in the refresh rate for system performance to be optimized; however, this current state of the art does not allow for this change to be made without the system being rebooted. As a result, previous solutions have been to either over-design the cooling system, which helps to prevent overheating of the DRAM modules under a variety of extreme heat conditions, but increases cost and energy consumption, or to permanently set the refresh rate at a high level (i.e., more refreshes per unit time), which negatively impacts system performance.

SUMMARY

A scheme is disclosed for adjusting a DRAM refresh rate responsive to changes in system conditions during operation. One embodiment is a method of dynamically adjusting a rate at which a DRAM module is refreshed in a computer system. The method comprises monitoring a plurality of system conditions; detecting a change in at least one of the monitored system conditions; responsive to the detection, determining an optimum refresh rate for a current state of the computer system; and setting the refresh rate to the determined optimum refresh rate.

DETAILED DESCRIPTION OF THE DRAWINGS

Figure 1:
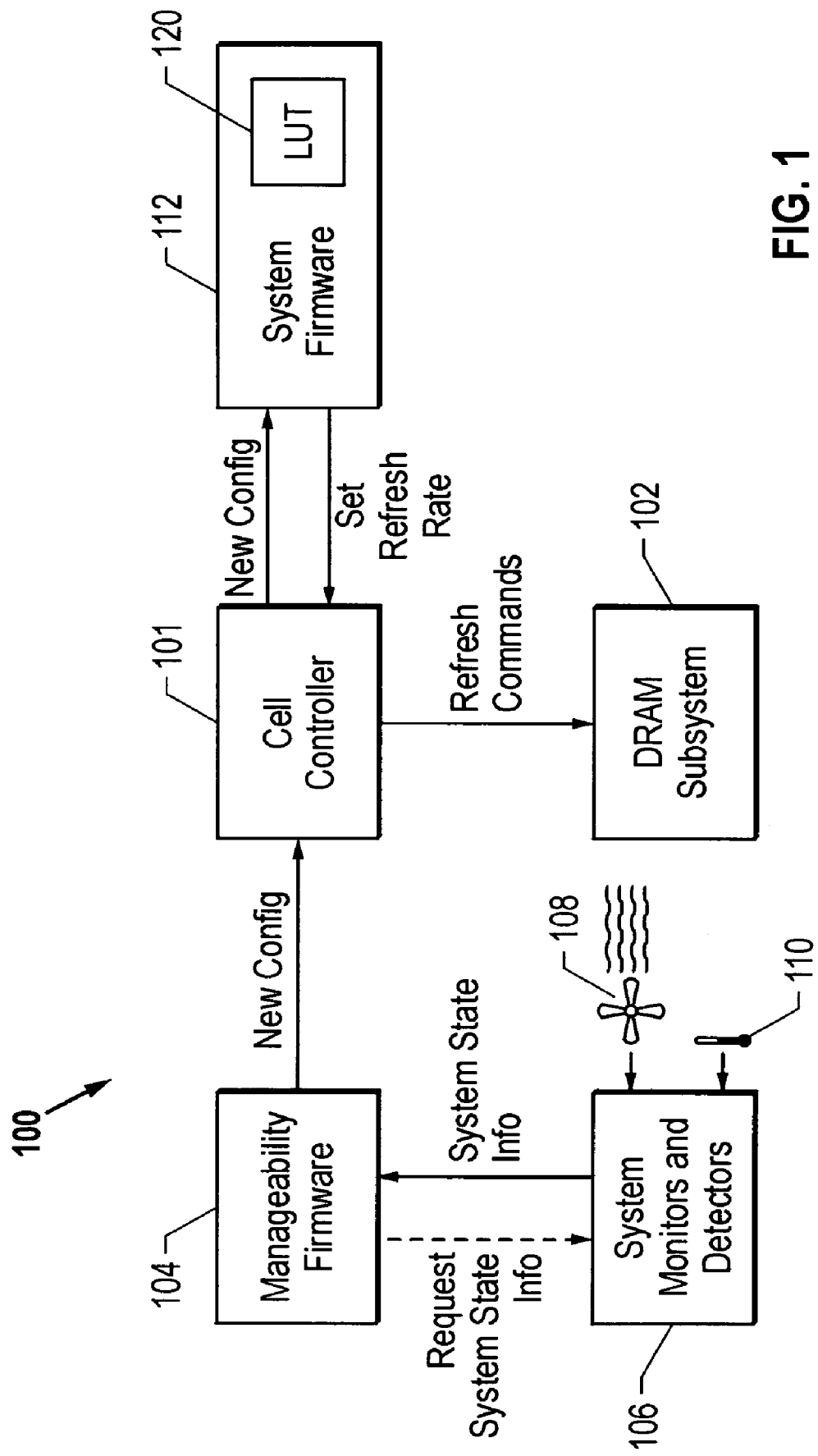
FIG. 1 is a block diagram of a portion of a computer system in accordance with one embodiment.

In the drawings, like or similar elements are designated with identical reference numerals throughout the several views thereof, and the various elements depicted are not necessarily drawn to scale.

FIG. 1 is a block diagram of a portion of a computer system 100 for implementing an embodiment of a method and system for dynamically adjusting the DRAM refresh rate responsive to changes in system conditions during system use. As illustrated in FIG. 1, the computer system 100 comprises a chipset, which in one embodiment is a cell controller 101, for issuing Refresh commands to a DRAM subsystem 102. It will be recognized that the DRAM subsystem 102 may comprise a plurality of DRAM modules each comprising DRAM cells, each cell for storing a bit of data. As previously discussed, in order to retain their charge and thus retain the data held therein, each cell must be refreshed from time to time. For example, this process is initiated by the periodic issuance of a Refresh command from the cell controller 101.

The system 100 further comprises manageability firmware 104 for receiving system state information from a plurality of system monitors and detectors 106. The manageability firmware comprises software executing on a processor for receiving the system state information and processing it as will be described in greater detail with reference to FIG. 2.

The system monitors and detectors 106 comprise a plurality of devices for monitoring and detecting system conditions in the system 100 that may affect the rate at which the DRAM subsystem 102 is optimally refreshed. For example, the system monitors and detectors 106 monitor the status of one or more cooling fans 108 designed to maintain the DRAM subsystem 102 at an optimum temperature. If the fan 108 becomes inoperable for some reason, this situation is detected by the system monitors and detectors 106 and reported to the manageability firmware 104 via the system state information. Likewise, when the repair or reinstatement of a cooling fan occurs, this situation is also detected. Similarly, the temperature of some portion of the system 100, as measured by one or more thermal sensing elements 110, is monitored by the system monitors and detectors 106 and reported to the manageability firmware 104 in a similar manner. Other conditions that can be monitored include power consumption, altitude, air pressure, DRAM manufacturer, memory module loading locations, and bus utilization, to name a few. Accordingly, the system monitors and detectors 106 may include appropriate devices, such as altimeters, barometers, performance counters, and the like, for measuring and detecting such system conditions.

In one embodiment, the system state information is automatically reported to the manageability firmware 104 at regular intervals. In another embodiment, the manageability firmware 104 polls the system monitors and detectors 106 for such information via a request for system state information issued thereto. In yet another embodiment, the system state information may be reported to the manageability firmware upon a change in the information; e.g., fan failure or temperature change.

As will be described in greater detail below, when the manageability firmware 104 detects a change in system state information, it issues a "New Config" command to system firmware 112 via the cell controller 101. The New Config command contains the system state information received from the system monitors and detectors 106. Responsive to receipt of a New Config command, the system firmware 112 determines an optimum refresh rate, given the current system state, and issues a "Set Refresh Rate" ("SRR") command to the cell controller 101 directing it to issue Refresh commands at the newly determined optimum rate. In one embodiment, the optimum refresh rate is determined using a multi-dimensional look-up table ("LUT") 120, wherein various system conditions (or ranges thereof) are mapped to corresponding optimum refresh rates. In another embodiment, the optimum refresh rate is determined using a formula that takes into account all of the pertinent conditions to develop an optimum refresh rate under the given set of conditions.

Figure 2:
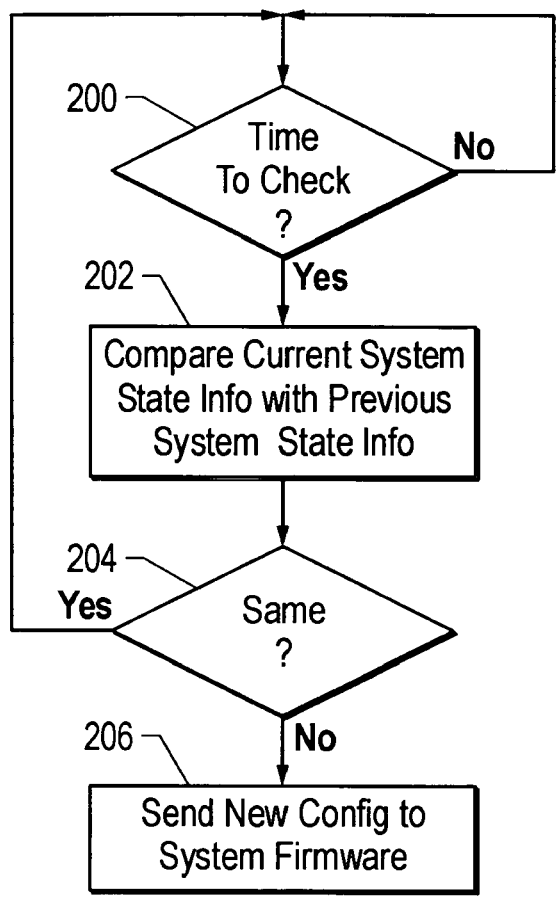
FIG. 2 is a flowchart of the operation of a manageability firmware loop of the computer system of FIG. 1.

FIG. 2 is a flowchart illustrating operation of the manageability firmware 104 in accordance with one embodiment. In block 200, a determination is made whether it is time to check the system state information. As previously indicated, this could result from expiration of a predetermined time period or from receipt of system state information from the system monitors and detectors 106. If not, execution remains at block 200; otherwise, execution proceeds to block 202. In block 202, the current system state information is compared with the previous system state information. In block 204, a determination is made whether the current and previous system state information is the same. If not, meaning there has been a change in system state, the manageability firmware 104 sends a New Config command to the system firmware 112 in block 206.

Figure 3:
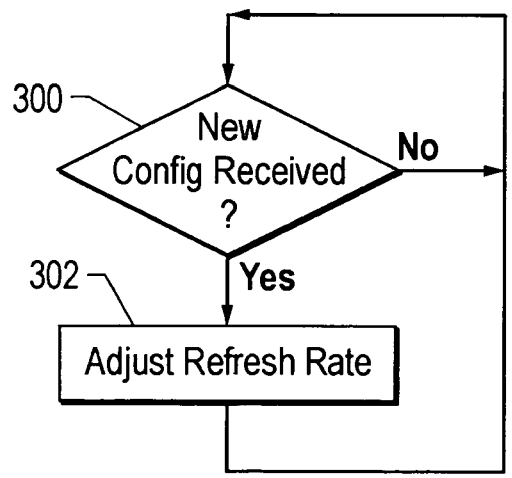
FIG. 3 is a flowchart of the operation of a system firmware loop of the computer system of FIG. 1.

FIG. 3 is a flowchart illustrating operation of the system firmware 112 in accordance with one embodiment. In block 300, a determination is made whether a New Config command is received. If not, execution remains at block 300; otherwise, execution proceeds to block 302, in which the system firmware 112 adjusts the refresh rate by determining an optimum refresh rate for the given conditions and then sends a Set Refresh Rate command to the cell controller 101 directing it to issue Refresh commands at the newly determined optimum refresh rate. As previously indicated, in one embodiment, the optimum refresh rate is determined using a multi-dimensional LUT, wherein various system conditions (or ranges thereof) are mapped to corresponding optimum refresh rates. In another embodiment, the optimum refresh rate is determined using a formula that takes into account all of the pertinent conditions to develop an optimum refresh rate under the given set of conditions. It will be recognized that any number of different methods could be used to determine the optimum refresh rate under the given set of conditions.

It will also be recognized that although the manageability firmware 104 and the system firmware 112 are illustrated as comprising separate elements, the functionality thereof could be implemented as a single element. Moreover, the functionality of the firmware 104, 112 could be implemented as more than two elements where desired.

An implementation of the invention described herein thus provides a method and system for dynamically adjusting a rate at which DRAM modules are refreshed within a computer system. In particular, not only is the performance of a computer system under normal operations ensured to be optimized, the teachings set forth herein allow the computer system to adjust to worst case operating conditions on-the-fly and subsequently to return to high-performance mode when conditions permit. Accordingly, the embodiments of the present patent application help avoid the high costs associated with over-design of environmental infrastructure associated with a computer system.

The embodiments shown and described have been characterized as being illustrative only; it should therefore be readily understood that various changes and modifications could be made therein without departing from the scope of the present invention as set forth in the following claims.

What is claimed is:

1. A method of dynamically adjusting a rate at which a dynamic random access memory ("DRAM") module is refreshed in a computer system, the method comprising:
   monitoring a plurality of system conditions;
   detecting a change in a first monitored system condition, wherein the change is detected in a monitored system condition selected from a group of system conditions including fan status, power consumption, altitude, air pressure, DRAM manufacturer, memory module loading locations, and bus utilization;
   responsive to the detection, determining an optimum refresh rate for a current state of the computer system; and
   setting the refresh rate to the determined optimum refresh rate.

2. The method of claim 1 wherein the monitoring is performed using a performance counter that monitors a select system condition.

3. The method of claim 1 wherein the monitoring is performed using an altimeter that monitors a select system condition.

4. The method of claim 1 wherein the monitoring is performed using a barometer that monitors a select system condition.

5. The method of claim 1 wherein the detecting comprises detecting failure of a cooling fan associated with the computer system.

6. The method of claim 5 wherein the determined optimum refresh rate is higher than an original refresh rate.

7. The method of claim 1 wherein the detecting comprises detecting repair of a cooling fan associated with the computer system.

8. The method of claim 7 wherein the determined optimum refresh rate is lower than an original refresh rate.

9. The method of claim 1 further comprising detecting a change in a second monitored system condition, wherein the determining comprises obtaining an optimum refresh rate corresponding to the first system condition and the second system condition in a multi-dimensional look-up table.

10. The method of claim 1 further comprising detecting a change in a second monitored system condition, wherein the determining comprises applying a formula to the first system condition and the second system condition, wherein a result of the applying comprises an optimum refresh rate corresponding to the first system condition and the second system condition.

11. The method of claim 1 wherein the setting comprises sending a Set Refresh Rate ("SRR") signal to a chipset connected to the DRAM module to set a rate at which Refresh commands are sent to the DRAM module.

12. A system for dynamically adjusting a rate at which a dynamic random access memory ("DRAM") module is refreshed in a computer system, the system comprising:
  means for monitoring a plurality of system conditions;
  means for detecting a change in first and second monitored system conditions;
  means responsive to detection of a change in the first and second monitored system conditions for determining an optimum refresh rate for a current state of the computer system using the first and second monitored system conditions; and
  means for setting the refresh rate to the determined optimum refresh rate.

13. The system of claim 12 wherein the monitored system conditions are selected from a group of system conditions including power consumption, altitude, air pressure, DRAM manufacturer, memory module loading locations, and bus utilization.

14. The system of claim 13 wherein the means for detecting comprises means for detecting failure of a cooling fan associated with the computer system.

15. The system of claim 14 wherein the determined optimum refresh rate is higher than an original refresh rate.

16. The system of claim 12 wherein the means for detecting comprises a measurement device selected from a group including a performance counter, an altimeter, and a barometer.

17. The system of claim 12 wherein the means for detecting comprises means for detecting repair of a cooling fan associated with the computer system.

18. The system of claim 17 wherein the determined optimum refresh rate is lower than an original refresh rate.

19. The system of claim 12 wherein the means for determining comprises a multi-dimensional look-up table wherein the first system condition and the second system condition map to a corresponding optimum refresh rate.

20. The system of claim 12 wherein the means for determining comprises means for applying a formula to the first system condition and the second system condition to calculate an optimum refresh rate.

21. The system of claim 12 wherein the means for setting comprises:
  system firmware for issuing a Set Refresh Rate ("SRR") signal to set a rate at which Refresh commands are sent to the DRAM module; and
  a chipset responsive to the SRR signal for issuing Refresh commands to the DRAM module.

22. The system of claim 21 wherein the chipset comprises a cell controller connected to the DRAM module.

23. The system of claim 12 wherein the means for detecting comprises manageability firmware.

24. A computer-readable medium operable with a computer system dynamically adjusting a rate at which a dynamic random access memory ("DRAM") module is refreshed in the computer system, the medium having stored thereon:
  instructions executable by the computer system for causing a plurality of system conditions to be monitored;
  instructions executable by the computer system for detecting a change in a first monitored system condition, wherein the first monitored system condition is selected from a group of system conditions including fan status, power consumption, altitude, air pressure, DRAM manufacturer, memory module loading locations, and bus utilization;
  instructions executable by the computer system responsive to detection of a change in the first monitored system condition for determining an optimum refresh rate for a current state of the computer system; and
  instructions executable by the computer system for setting the refresh rate to the determined optimum refresh rate.

25. The computer-readable medium of claim 24 wherein the instructions executable by the computer system for detecting comprise instructions for detecting failure of a cooling fan associated with the computer system.

26. The computer-readable medium of claim 25 wherein the determined optimum refresh rate is higher than an original refresh rate.

27. The computer-readable medium of claim 24 wherein the instructions executable by the computer system for detecting comprise instructions for detecting reinstatement of a cooling fan associated with the computer system.

28. The computer-readable medium of claim 27 wherein the determined optimum refresh rate is lower than an original refresh rate.

29. The computer-readable medium of claim 24 further comprising instructions executable by the computer system for detecting a change in a second monitored system condition, wherein the instructions executable by the computer system for determining comprise instructions for obtaining an optimum refresh rate corresponding to the first system condition and the second system condition in a multi-dimensional lookup table.

30. The computer-readable medium of claim 24 further comprising instructions executable by the computer system for detecting a change in a second monitored system condition, wherein the instructions executable by the computer system for determining comprise instructions for applying a formula to the first system condition and the second condition, wherein a result of the applying comprises an optimum refresh rate corresponding to the first system condition and the second system condition.

31. The computer-readable medium of claim 24 wherein the instructions executable by the computer system for setting comprise instructions for sending a Set Refresh Rate ("SRR") signal to a chipset to set a rate at which Refresh commands are sent to the DRAM module.

* * * * *

UNITED STATES PATENT AND TRADEMARK OFFICE
CERTIFICATE OF CORRECTION

| | |
|---|---|
| PATENT NO. | : 7,305,518 B2 |
| APPLICATION NO. | : 10/969662 |
| DATED | : December 4, 2007 |
| INVENTOR(S) | : Roy Mehdi Zeighami et al. |

It is certified that error appears in the above-identified patent and that said Letters Patent is hereby corrected as shown below:

In column 6, line 47, in Claim 29, delete "lookup" and insert -- look-up --, therefor.

Signed and Sealed this

Twenty-seventh Day of May, 2008

JON W. DUDAS
*Director of the United States Patent and Trademark Office*